(12) United States Patent
Allott et al.

(10) Patent No.: US 6,750,715 B2
(45) Date of Patent: Jun. 15, 2004

(54) LOGARITHMIC IF AMPLIFIER WITH DYNAMIC LARGE SIGNAL BIAS CIRCUIT

(75) Inventors: Stephen Allott, Scotts Valley, CA (US); Iain Butler, Aptos, CA (US)

(73) Assignee: Zeevo, Inc., Santa Clara, CA (US)

( * ) Notice: Subject to any disclaimer, the term of this patent is extended or adjusted under 35 U.S.C. 154(b) by 0 days.

(21) Appl. No.: 09/836,624

(22) Filed: Apr. 16, 2001

(65) Prior Publication Data

US 2002/0149418 A1 Oct. 17, 2002

(51) Int. Cl.[7] .................................................. H03F 3/45
(52) U.S. Cl. ...................... 330/258; 330/259; 330/261; 330/296; 327/307; 327/346
(58) Field of Search ................................. 330/258, 259, 330/261, 296; 327/307, 346

(56) References Cited

U.S. PATENT DOCUMENTS 6,052,025 A * 4/2000 Chang et al. ............... 330/253
6,265,941 B1 * 7/2001 Lopata ....................... 330/258

OTHER PUBLICATIONS

Kimura, "A CMOS Logarithmic IF Amplifier with Unbalanced Source–Coupled Pairs", IEEE Journal of Solid–State Circuits, vol. 28, No. 1, Jan. 1993 p. 78 only.

Rofougaran et al., "A Singlt–Chip 900–MHz Spread–Spectrum Wireless Tranceiver in 1–µm CMOS—Part I: Architecture and Transmitter Design", IEEE Journal of Solid–State Circuits, vol. 33, No. 4, Apr. 1998 p. 515 only.

* cited by examiner

Primary Examiner—Michael B Shingleton
(74) Attorney, Agent, or Firm—Townsend and Townsend and Crew LLP; J. Matthew Zigmant

(57) ABSTRACT

Methods and apparatus of amplifying signals. One method includes receiving a variable power supply, generating a variable bias current, and applying the bias current to a load such that an average output voltage is generated. The method further includes receiving an input signal, generating a current proportional to the input signal, and subtracting the current from the variable bias current. As the variable power supply changes value by a first amount, the variable bias current is varied such that the average output voltage varies by the first amount.

23 Claims, 12 Drawing Sheets

LOGARITHMIC IF AMPLIFIER WITH DYNAMIC LARGE SIGNAL BIAS CIRCUIT

BACKGROUND OF THE INVENTION

The present invention relates to wireless integrated circuits, specifically to logarithmic amplifiers.

We are presently in the midst of a wireless revolution. Mobile phones, once a novelty referred to as car phones, have become ubiquitous. Wireless personal data assistants, local and wide area networks, and computer connections are now everyday pieces of business equipment. Data and voice telecommunications have changed the structure of the economy, and have changed the way people live. And now, a host of new products, enabled by the Bluetooth standard, are poised to enter a marketplace driven by the promise of a wireless Internet. The present invention provides important improvements to a key circuit used in wireless systems.

This circuit is a logarithmic amplifier. These amplifiers are useful in buffering signals, providing gain in the intermediate frequency (IF) path of both the transmitter and receiver, and in receive signal strength indicators.

Wireless devices typically transmit and receive data through the air on high frequency electromagnetic waveforms, though some systems, such as satellite dishes and pagers, simply receive, and others merely transmit. Data transmission is begun by encoding the data to be transmitted. In Bluetooth systems, encoded data typically has a rate of 1.5 MHz and is used to modulate a high frequency electromagnetic carrier signal. This carrier signal is in the 2.44 GHz range. The modulated carrier signal is then applied to an antenna for broadcasting. The broadcast signal is referred to as a radio frequency (RF) signal. Data reception involves receiving the RF signal on two antennas, and selecting the antenna with the stronger reception. The signal is then amplified, demodulated, filtered, and decoded.

In typical wireless systems, data is transmitted and received in packets having a specified structure and length. Each packet begins with a preamble, at least part of which contains no information. Part of the preamble is received using each antenna, and the receive signal strength for each antenna are compared. The antenna with the better signal is selected, and used for the remainder of the packet. For proper antenna selection, it is desirable that accurate measurements are made, and that they do not fluctuate with temperature, processing, and supply voltage.

SUMMARY OF THE INVENTION

Accordingly, embodiments of the present invention provide a logarithmic amplifier having a reduced sensitivity to power supply changes. Specifically, a common-mode feedback circuit is used to adjust the common-mode output voltage such that it tracks the supply voltage. In this way, cascoded output current sources are isolated from supply variations. Also included is an offset amplifier that enables multiple amplifiers to be cascaded without the use of intervening AC coupling capacitors. The design reduces the tolerance of the pole location of the high pass filter characteristic of the offset amplifier.

Embodiments of the present invention provide methods and apparatus of amplifying signals. One exemplary method includes receiving a variable power supply, generating a variable bias current, and applying the bias current to a load such that an average output voltage is generated. The method further includes receiving an input signal, generating a current proportional to the input signal, and subtracting the current from the variable bias current. As the variable power supply changes value by a first amount, the variable bias current is varied such that the average output voltage varies by the first amount.

A further exemplary embodiment of the present invention provides a circuit for amplifying signals. The circuit includes an input stage configured to convert an input signal to a first current, a current source stage configured to provide a bias current capable of being varied, an output stage configured to convert the bias current, less the first current, to an output voltage, and common-mode feedback circuit configured to receive a common-mode feedback voltage and the output voltage. The common-mode feedback circuit varies the bias current such that an average of the output voltage is equal to the common-mode feedback voltage.

Yet a further embodiment of the present invention provides a circuit for amplifying signals. This circuit includes a first device coupled between a first node and a first terminal of a resistor, having a control electrode coupled a first input terminal, a second device coupled between a second node and a second terminal of the resistor, having a control electrode coupled a second input terminal, a third device coupled between a first supply node and the first node, having a control electrode coupled to a common-mode feedback circuit, and a fourth device coupled between the first supply node and the second node, having a control electrode coupled to the common-mode feedback circuit. The circuit also includes a first output load coupled between the first node and the second supply node, and a second output load coupled between the second node and the second supply node. The first output load and second output load couple to the common-mode feedback circuit.

A better understanding of the nature and advantages of the present invention may be gained with reference to the following detailed description and the accompanying drawings.

DETAILED DESCRIPTION

Figure 1:
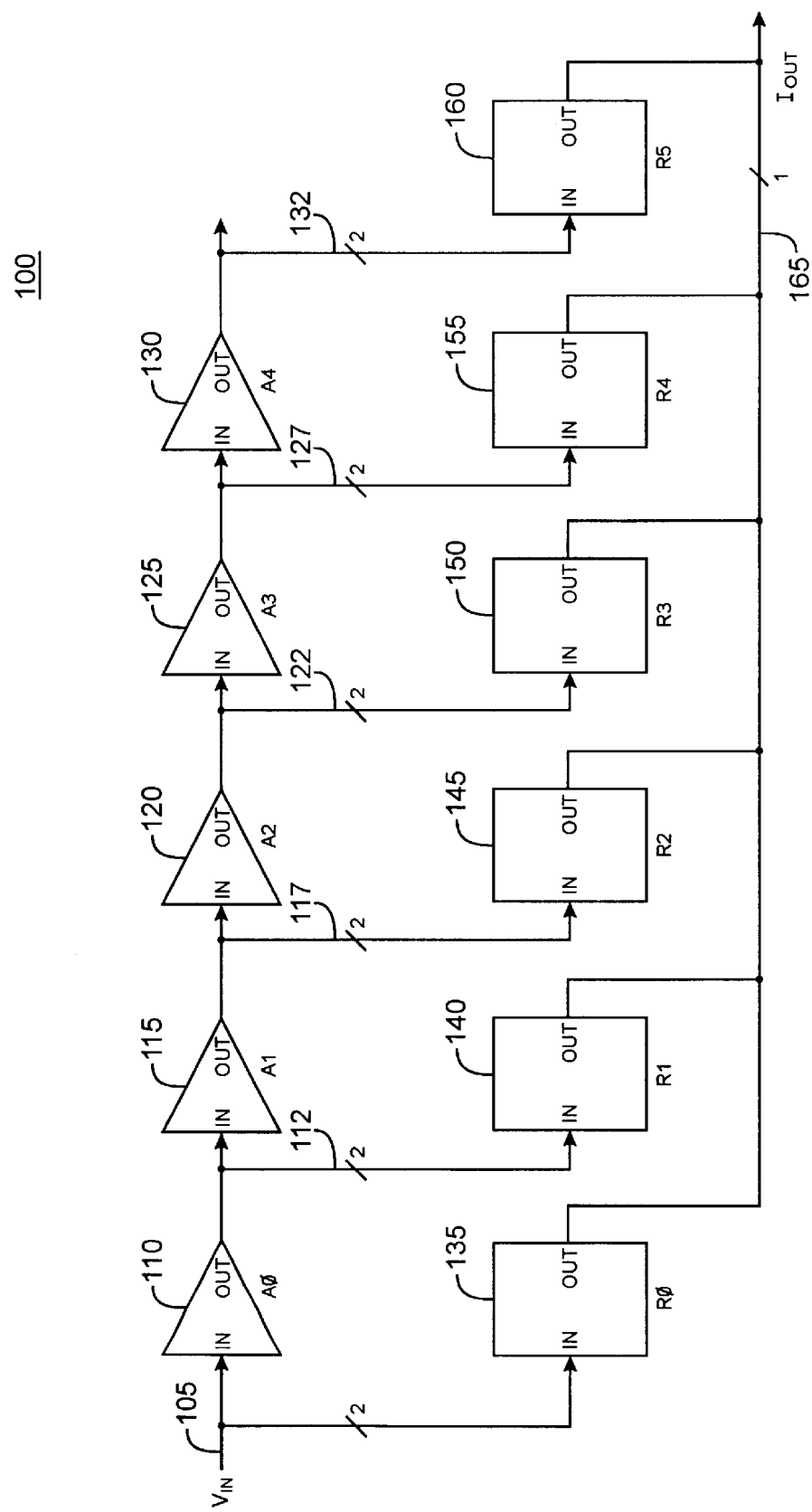
FIG. 1 is a block diagram for a received signal strength indicator (RSSI) circuit consistent with embodiments of the present invention.

FIG. 1 is a block diagram for a received signal strength indicator (RSSI) circuit consistent with embodiments of the present invention. Included is a chain of n logarithmic amplifiers and n+1 rectifiers. In this specific example, n is equal to 5, and a chain of five logarithmic amplifiers are coupled to six rectifiers. Alternately, other numbers of logarithmic amplifiers and rectifiers may be used. For example, six or more logarithmic amplifiers may be used along with six, seven or more rectifiers. RSSI circuit 100 is typically on an integrated circuit.

The amplifiers A0 110, A1 115, A2 120, A3 125, and A4 130 are coupled in series. Each logarithmic amplifier stage provides gain, and since they are cascaded, they provide gain in a cumulative fashion. Specifically, if the gain of each stage is 5.6 dB, the cumulative gain through all five stages is five times 5.6 or 28 dB.

The output of each amplifier, as well as the input of the first amplifier A0 110 are coupled to a rectifier. The rectifiers may be MOS full wave rectifiers including two identical, unbalanced, source-coupled pairs with different W/L ratios whose inputs are cross-coupled and whose outputs are connected in parallel. The rectifiers R0 135, R1 140, R2 145, R3 150, R4 155, and R5 160 output currents, which are summed on line 165 and provided as a current output Iout. An input voltage Vin is applied on lines 105. Vin may be single ended or differential. In an embodiment of the present invention, Vin is differential, as are the output and inputs of each amplifier. In this embodiment, Iout is single ended.

RSSI circuit 100 provides a current Iout that is proportional to the logarithm of the amplitude of the input signal Vin on line 105. That is, the RSSI circuit 100 provides a current output that is "linear on a log scale." Again, this function may be used in an RF receiver in determining which of two or more antennas are receiving a signal more clearly. These antennas may be at right angles to each other, or offset a distance corresponding to a portion of a waveform from each other. Again, the RSSI measurements are typically taken during a preamble, or startup portion of a data packet. The preferred antenna is then identified and used for the remainder of the data packet's transmission.

This RSSI function can also be used in adjusting transmit power. For example, if a signal is received clearly, then the receiver may be close to the transmitting source. This indicates that it will be easy for the receiving unit to transmit data back in the opposite direction. Accordingly, the transmit power of the receiving unit may be reduced, thus saving power and increasing battery life.

By way of explanation, it can be considered what happens when a signal having an amplitude that increases with time is applied at the input. When the amplitude of the signal Vin on line 105 is equal to zero, there is no signal to be amplified, and there are no signals at the outputs 112, 117, 122, 127, and 132 of the logarithmic amplifiers. Accordingly, there are no signals to be rectified, so there is no current signal Iout on line 165. Depending on the implementation of the rectifiers, there may be some current corresponding to a zero output level.

As signal Vin on lines 105 begins to increase above the minimum sensitivity level of the RSSI block, the output signal levels at the operative amplifiers A1 110, A1 115, A2 120, and A3 125, remain small. That is, the current contributions of rectifiers R0 135, R1 140, R2 145, R3 150, and R4 155 are negligible. But the output signal level of amplifier A4 130 increases, and rectifier R5 160 contributes current to the Iout signal on line 165. As Vin increases further, the output swing of amplifier A3 125 similarly increases, as does the current output of rectifier R4 155 and Iout. As the signal Vin on line 105 continues to increase, the output of amplifier A4 130 limits, that is it generates the largest output signal that it can. At this point, the output of rectifier R5 160 is at its maximum. In this way, as the signal Vin continues to increase, the output of each amplifier increases and eventually limits, as does the current contribution from the corresponding rectifier.

The cascaded amplifiers are designed such that they can be DC coupled as shown. The output of each amplifier is directly tied to the inputs of the next amplifier. For example, the output of amplifier 110 is directly connected to the inputs of amplifier A1 115. Typically, cascaded amplifiers are AC coupled between every stage, or between every two or three stages. That is, the output of each amplifier connects to one side of a capacitor, and the other side of the capacitor ties to the input of the succeeding amplifier, and to a resistor. The other side of the resistor is tied to a bias voltage, which sets the common mode input voltage for the following amplifier.

AC coupling is used so that offsets do not accumulate through the amplifier chain. A small offset at the input of the first amplifier is gained to a larger offset voltage at its output. The AC coupling capacitors block this offset voltage from appearing as the input voltage of the next amplifier. Typically, without these DC blocks, the offsets would be gained and would hard limit the amplifier chain in one direction after approximately three amplifiers. Also, these DC blocks, since they filter low-frequency signals, reduce 1/f noise in the amplifier chain.

Since it is desired that the coupling circuits do not attenuated the desired signal Vin, the pole created by the RC network at the input of each amplifier should be very low frequency. But this requires the use of a large capacitor and large resistor, which take up valuable die "real estate." Also, the exact frequency of the poles are highly variable. On-chip capacitors and resistors each typically vary 20 percent, meaning that a pole location cannot be controlled tighter than approximately 40 percent.

By enabling the removal of the AC coupling capacitors, embodiments of the present invention save die area. Besides allowing for the removal for of the AC coupling capacitors and their associated resisters, embodiments of the present invention provide a logarithmic amplifier having a superior power supply rejection ratio (PSRR), particularly under large signal conditions. Also, as will be seen below, an amplifier designed according to embodiments of the present invention provide for excellent tolerance of the low-frequency pole locations.

Figure 2:
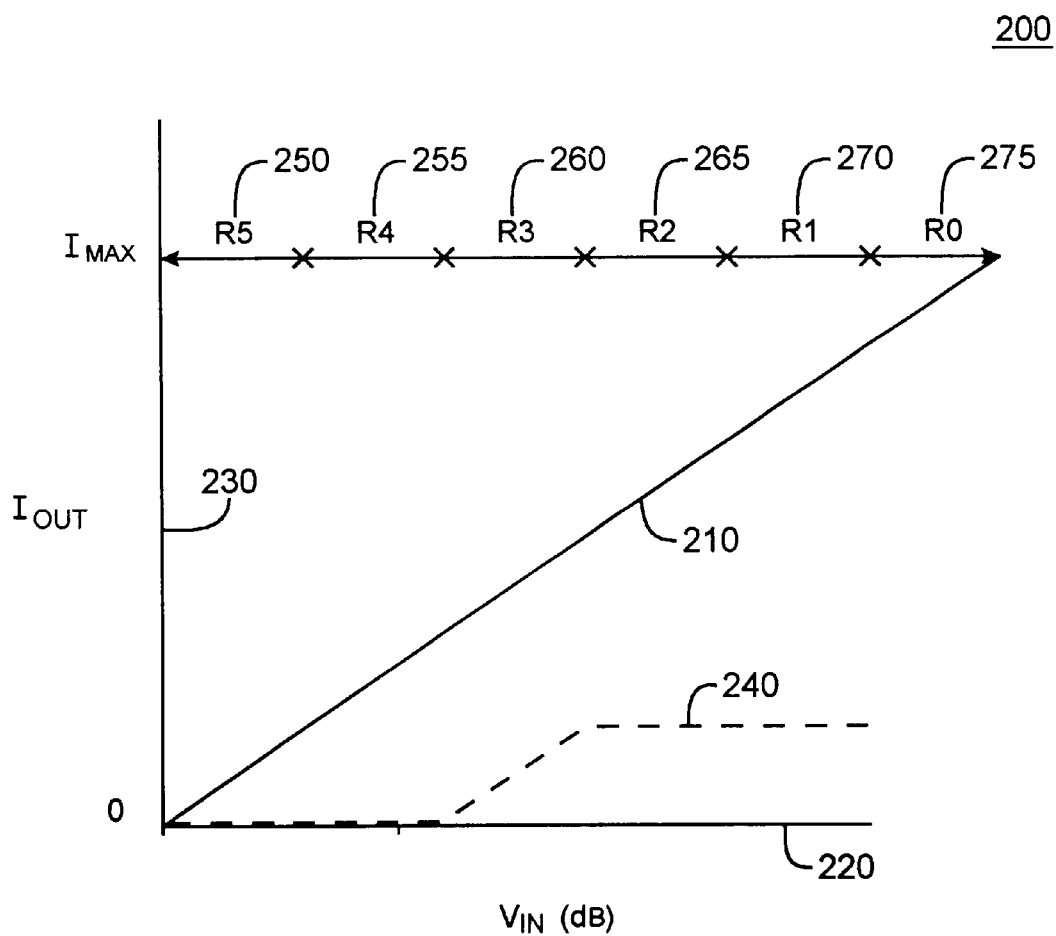
FIG. 2 shows the transfer characteristics of the RSSI circuit in FIG. 1.

FIG. 2 shows the transfer characteristics of the RSSI circuit in FIG. 1. The output current signal Iout on line 165 is plotted as a function of the input signal Vin on line 105. The Iout axis 230 is linear and the Vout axis is logarithmic, or linear in dB. Again, at signal levels of Vin below the RSSI block's minimum sensitivity, the output current Iout is zero. As Vin increases, successive rectifiers R5 250, R4 225, R3 260, R2 265, R1 27, and R0 275 cumulatively contribute current to Iout. For example, the contribution of rectifier R3 is shown as dashed line 240. At low signal levels, rectifier R3 contributes little or no current.

At a higher signal level R3 begins to conduct, and at still higher levels it is contributing all of the current that it can, at which point its current levels off.

Figure 3:
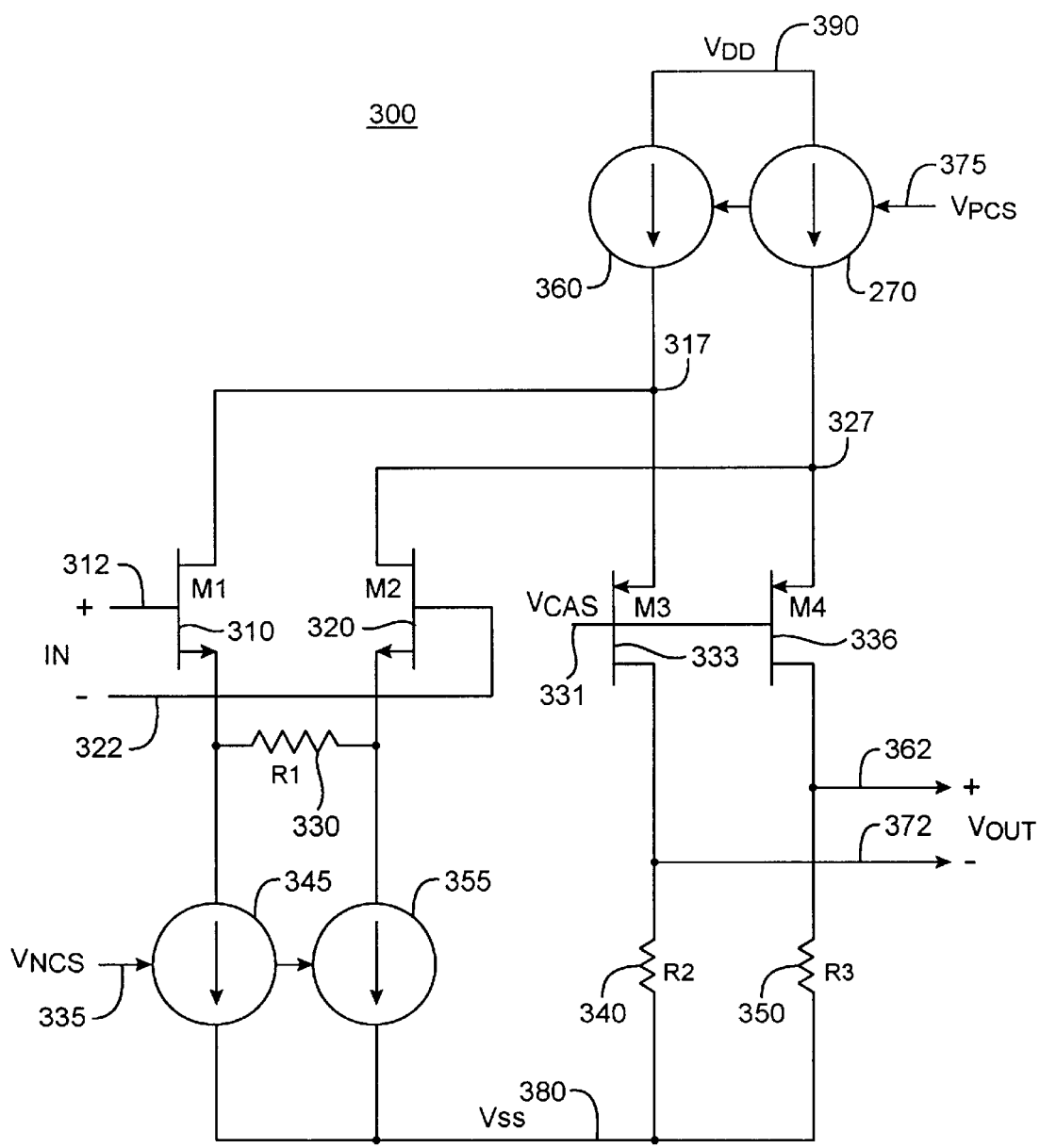
FIG. 3 is a simplified schematic of a logarithmic amplifier that may be used as the logarithmic amplifiers in FIG. 1.

FIG. 3 is a simplified schematic of a logarithmic amplifier 300 that may be used as the logarithmic amplifiers A0 110, A1 115, A2 120, A3 125, and A4 130 in FIG. 1. This architecture is known as a folded cascode. Included are differential pair M1 310 and M2 320, linearizing resistor R1 330, current sources 345, 355, 360, and 370, cascode devices M3 333 and M4 336, and output load resisters R2 340 and R3 350. A first supply voltage VDD is provided on line 390, and a second supply voltage VSS is provided on line 380. A first bias voltage VNCS is applied on line 335, and sets the current in the current sources 345 and 355. A second bias voltage VPCS is applied on line 375, and sets the current in the current sources 360 and 370. A third bias voltage is applied on line 331 to the gates of cascode devices M3 333 and M4 336.

A differential input signal is applied between terminals 312 and 322. Most of this differential input voltage appears across resistor R1 330, steering the current from current sources 345 and 355 through devices M1 310 and M2 320. These currents are subtracted at nodes 317 and 327 from the bias currents provided by current sources 360 and 370 respectively. The remaining portions of the bias currents provided by current sources 360 and 370 that are not diverted to devices M1 310 and M2 320, flow through the cascode devices M3 333 and M4 336 and into load resisters R2 340 and R3 350, thereby generating an output voltage Vout between nodes 362 and 372. Specifically, if the input voltage is positive, the voltage on line 312 is greater than the voltage on line 322, and the current in M1 310 is equal to the current of current source 345 plus the portion of the current from current source 355 that is diverted through resistor R1 330. This increased current at nodes 317 reduces the current available through device M3 333 and R2 340, thus decreasing the voltage at node 372. Similarly, the current through M2 320 decreases, and more current from current source 370 flows through cascode device M4 336, and into load resistor R3 350. Accordingly, the voltage at node 362 increases and the output signal between nodes 362 and 372 increases. In this way, a signal applied to the input terminals 312 and 322 result in an output signal at nodes 362 and 372.

This circuit has its limitations, particularly under large signal conditions. It is very desirable for integrated circuits in to be minimally affected by changes in the supply voltage, temperature, and processing. A measure of a circuit's ability to withstand changes in the supply voltage is referred to as the power supply rejection ratio (PSRR). An excellent way to improve the PSRR of the amplifier shown is to ensure that the control voltage VPCS on line 375, which controls the current sources 360 and 370, as well as the bias line VCAS on line 331, each track supply changes in the supply VDD 390. For example, VCAS may be a diode, a multiple of a diode, a fixed voltage, or combination thereof, below VDD. For small signals at Vout this works quite well. As VDD decreases the drain to source voltages of M3 333 and M4 336 decrease. So long as devices M3 333 and M4 336 remain in their saturation or high output impedance region, the Vgs of devices M3 333 and M4 336 remain fairly constant, and have little affect on current sources 360 and 370.

But it is very desirable to produce large output swings at Vout. For one reason, a larger signal swing improves a circuit's signal to noise ratio. Also, the circuit is less susceptible to power supply and chip switching noise. If the signal at Vout is large, as VDD decreases the cascode devices M3 333 and M4 336 enter their triode or linear region of operation. When this happens, their gate-to-source voltage (Vgs) increases dramatically, altering the currents supplied by current sources 360 and 370, thus changing the output voltage at Vout. Specifically, if VDD is reduced while the voltage at 362 is high, the cascode device M4 336 enters its linear region. The Vgs of M4 increases, thus raising the voltage at node 327. This voltage reduces the current available from current source 370, thus decreasing the voltage at 362. Accordingly, the output voltage Vout decreases. Therefore, to improve this circuit's PSRR under large swing conditions, it is desirable to reduce the VDD voltage at which the cascode devices enter the linear region.

Accordingly, an embodiment of the present invention adjusts the bias voltage VPCS to improve the PSRR. Specifically, as VDD decreases, the currents in current sources 360 and 370 are reduced. This reduces the output voltage at nodes 362 and 372, thereby reducing the VDD voltage at which the cascode devices enter the linear region. Such an embodiment is shown in the following figure.

Figure 4:
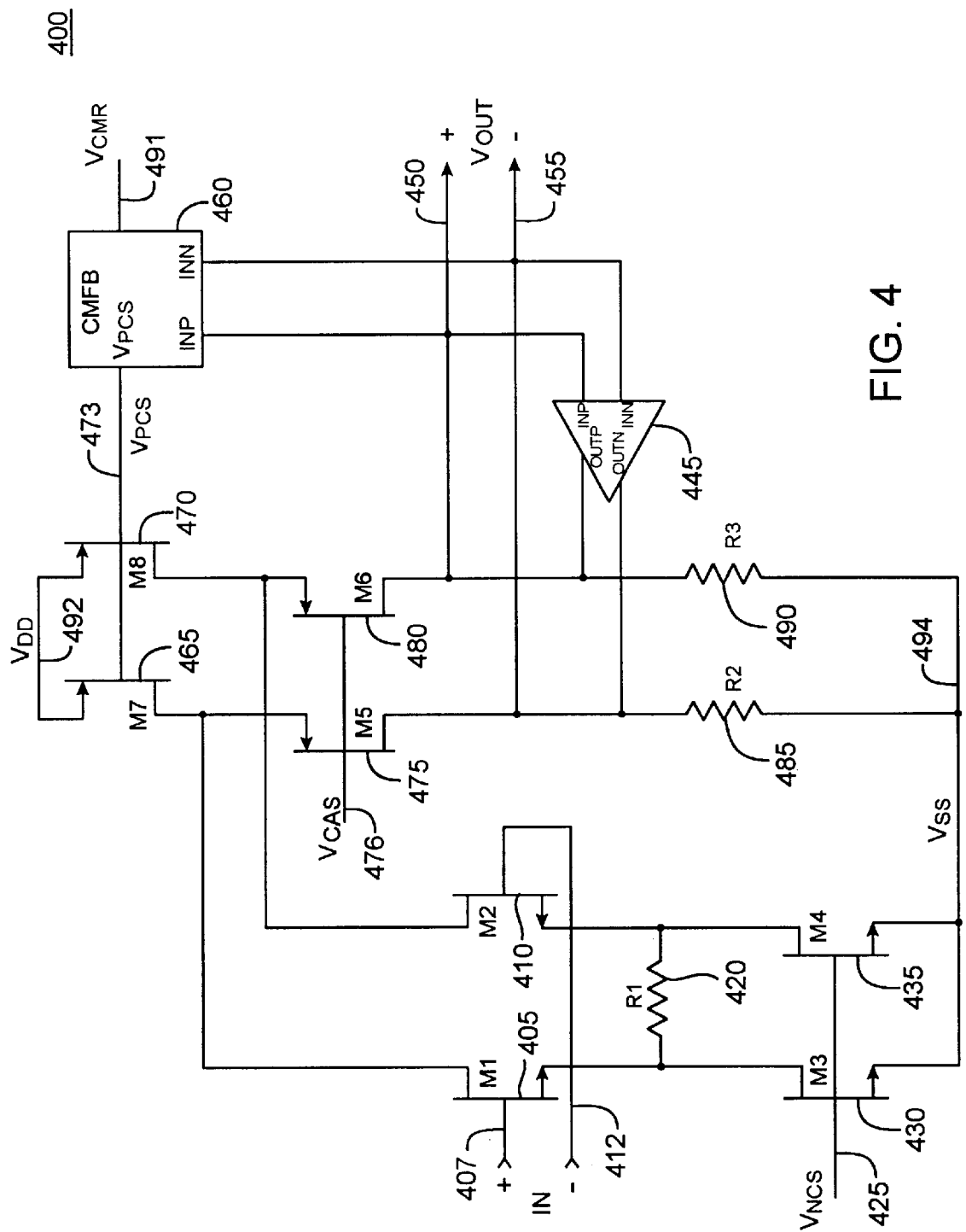
FIG. 4 is a schematic of a logarithmic amplifier consistent with an embodiment of the present invention.

FIG. 4 is a schematic of a logarithmic amplifier 400 consistent with one embodiment of the present invention. Included are differential pair devices M1 405 and M2 410, along with linearizing resistor R1 420, n-channel current sources M3 430 and M4 435, p-channel current sources M7 465 and M8 470, cascode devices M5 475 and M6 480, load resisters R2 485 and R3 490, common-mode feedback circuit 460, and offset amplifier 445. In one embodiment of the present invention, M1 405 and M2 410 are NMOS devices, each having a size 3.6/1.8 and m=5, where 3.6 is the width in microns, and 1.8 is the length in microns, and m is the number of parallel transistors, M3 430 and M4 435 are NMOS devices each having a size 3.6/2.34, m=8, M5 475 and M6 480 are PMOS devices, each having a size 10.8/0.18, m=4, M7 465 and M8 470 are PMOS devices, each having a size 2.5/3, m=4, R1 is 50 k, and R2 and R3 each have a resistance of 100 k ohms. It will be obvious to one skilled in the art that other sizes are possible consistent with the present invention. Furthermore, some or all of the NMOS devices may be replaced with bipolar npn devices, and some or all of the PMOS devices may be replaced with bipolar pnp devices. Alternately, the whole circuit can be inverted, such that the input devices and their current sources are PMOS, and the cascodes and cascoded current sources are NMOS. Further, with proper arrangement of the DC bias voltages, cascode devices M5 475 and M6 480 can be removed. This figure, as with all the included figures, are shown for explanatory purposes, and do not limit the scope of the invention or claims.

A first supply voltage VDD is provided on line 492, and a second supply voltage VSS is provided on line 494. In an embodiment of the present invention, VDD is 1.8 volts and VSS is ground or zero volts. Alternately, VDD may be other voltages, such as 2.5 or 3.3 volts. In other embodiments, VDD is ground or zero volts, and VSS is a negative voltage, such as −1.8 volts. A bias voltage VNCS is applied on line 425 between the gates and sources of M3 430 and M4 435, thereby generating currents in their drains. A common mode reference voltage VCMR is applied on line 491 to the common-mode feedback block 460, which generates a bias voltage VPCS on line 473. VPCS is applied to the gates of current source devices M7 465 and M8 470 relative to the sources, thereby generating a current in their drains.

An input signal is applied between lines 407 and 412 resulting in a differential voltage between the gates of M1 405 and M2 410. Most of this differential voltage appears across resistor R1 420, though a portion appears as a change in the Vgs of M1 405 and M2 410. The voltage across R1 420 steers current between devices M1 405 and M2 410, the drain currents of which are then subtracted from the currents generated by current source devices M7 465 and M8 470. The portion of current of M7 465 and M8 470 which are not diverted to M1 405 and M2 410, flow through cascode devices M5 475 and M6 480 and load resisters R2 485 and R3 490, resulting in an output voltage between lines 450 and 455.

Specifically, if the input voltage is positive, the voltage on line 407 is greater than the voltage on line 412, and the gate of device M1 405 is higher than the gate of device M2 410. Resistor R1 420 shunts some of the current provided by current source M4 435 to device M1 405. The current in device M1 405 increases, while the current in device M2 410 decreases. M1 405 diverts more current from device current source device M7 465, thus reducing the current flow in cascode device M5 475 and R2 485, which reduces the voltage on line 455. Similarly, the current in M2 410 decreases, leaving more current from M8 470 available for cascode device M6 480, were it appears across resistor R3 490, resulting in an increase in the voltage on line 450. In this way, a voltage applied between lines 407 and 412 results in a signal at appearing at Vout between lines 450 and 455. The gain of this circuit may be approximated by the value of R2 485 divided by one-half of the value of R1 420.

Again, to increase the circuit's PSRR, the voltage VCAS on line 476 tracks the supply voltage VDD on line 492. That is, if VDD is reduced by an amount of voltage, then the voltage VCAS on line 476 is reduced by that same amount. If VDD decreases, at some point as each output node is high, its corresponding cascode device triodes, and reduces the current in its current source, which reduces the output swing. The larger the output voltage, the higher the VDD at which this occurs. The common-mode feedback circuit 460 mitigates this problem, and improves this logarithmic amplifier's PSRR. The common-mode feedback adjusts the current in M7 465 and M8 470 as a function of the supply voltage VDD on line 492. Specifically, if the voltage VDD on line 492 decreases, the voltage VPCS provided by the common-mode feedback block 460 increases, reducing the gate-source voltages of devices M7 465 and M8 470, thereby reducing their drain currents. Since both currents are reduced together, the voltage at both output nodes drop together, so there is no loss of output swing.

To understand how this feedback improves the PSRR, it is important to note the difference between the AC and DC portions of the output signal. Ignoring any contributions from the output amplifier, the AC component of the output voltage on lines 450 and 455 is determined by the AC currents in resisters R2 485 and R3 490. These currents are generated by AC voltages between lines 407 and 412, which generate transient (AC) currents in the drains of M1 405 and M2 410, which subtract from the DC currents in the drains of M7 and M8, and result in AC currents through cascode devices M5 475 and M6 480.

As before, if VDD is reduced while output node 450 is high, M6 enters its triode region, and the current in M8 470 decreases. But the other output node 455 is low, so M5 475 remains saturated, and the current in M7 465 does not decrease, This difference in current appears as an AC signal at the output nodes, and reduces the swing at the output. The DC component of the current in R2 485 is equal to the drain current in M1 465 less the drain current of M3 430. Similarly, the DC component of the current through R3 490 is equal to the drain current in M8 470 less the drain current in M4 435. Accordingly, as the bias voltage VPCS on line 473 increases, the Vgs of devices M7 465 and M8 470 decreases, the currents in resisters R2 485 and R3 490 decrease, and the output voltages on lines 450 and 455 decrease. In this way, the common-mode feedback block 460 can change the currents in current sources M7 465 and M8 470, while only affecting the DC levels, and not the AC swing at the output. Since the DC levels at the output decrease, VDD can be reduced without the cascade devices entering the triode region.

In this way, at a nominal supply voltage, the output voltage levels can be set for optimum circuit performance. As the supply voltage decreases, the DC output voltage levels can be decreased, such that the output swings are maintained.

Figure 5:
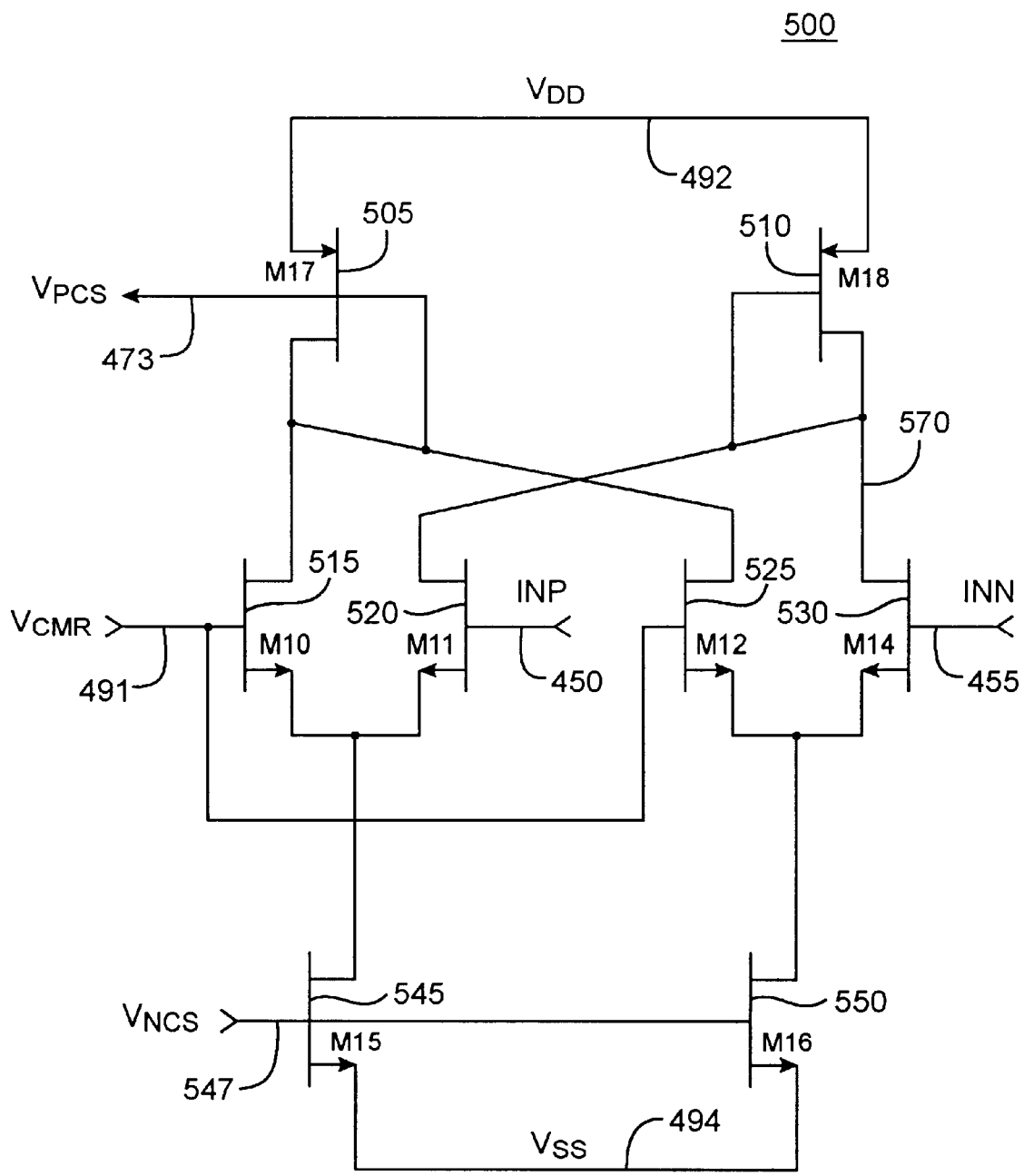
FIG. 5 is a schematic of a common-mode feedback circuit which is used as the common-mode feedback circuit in FIG. 4.

FIG. 5 is a schematic of a common-mode feedback circuit 500 that may be used as the common-mode feedback circuit 460 in FIG. 4. Included are first differential pair M10 515 and M11 520, second differential pair M12 525 and M14 530, current sources M15 545 and M16 550, and diode connected devices M17 505 and M18 510. In one embodiment of the present invention, M10 515, M11 520, M12 525, and M14 530 are NMOS devices, each having a size of 5/0.36, m=8, M15 545 and M16 550 are NMOS devices, each having a size of 3.6/2.4, m=8, and M17 505 and M18 510 are PMOS devices, each having a size 1.44/3, m=4. It will be obvious to one skilled in the art that other sizes are possible consistent with the present invention. Furthermore, some or all of the NMOS devices may be replaced with bipolar npn devices, and some or all of the PMOS devices may be replaced with bipolar pnp devices. Alternately, the whole circuit can be inverted, such that the input devices and their current sources are PMOS, and the diode connected devices are NMOS.

The circuit receives a common mode reference voltage on line 491 and input voltages INP on line 450 and INN on line 455. Bias voltage VNCS is applied on line 547 to the gates of n-channel current sources M15 545 and M16 550, thus generating a current in the drains of these devices. The bias voltage VNCS on line 547 may be the same bias voltage VNCS applied to current to source devices M3 430 and M4 435 of FIG. 4. Alternately, the two circuits may have separate bias voltages. The circuit generates the bias line VPCS on line 473. The diode connected device M18 510 is added to match the collector voltages in the differential pairs.

The circuit provides part of a feedback pat such that the average values of signals INP on line 450 and INN on line 455 are equal to the common-mode reference voltage applied on line 491. Specifically, if the average voltage at lines INP 450 and INN 455 are higher than the common-mode reference voltage on line 491, devices M11 520 and M14 530 conduct a greater portion of the drain currents of M15 545 and M15 550, shunting them to device M18 510. Accordingly, the currents in devices M10 515 and M12 525 decrease, thereby reducing to current in M17 505. This increases the voltage VPCS on line 473, resulting in a decrease in the Vgs voltage of M7 465 and M8 470 in FIG. 4, This reduction in Vgs reduces the current through R2 485 and R3 490, also in FIG. 4, thereby reducing the output voltages on lines 450 and 455, which are the input voltages INP and INN to the circuit of FIG. 5. In this way, this circuit, along with the circuit in FIG. 4, provides a feedback pat whereby the output voltages of the logarithm amplifier of FIG. 4 tracks the common-mode reference voltage on line 491.

Figure 6:
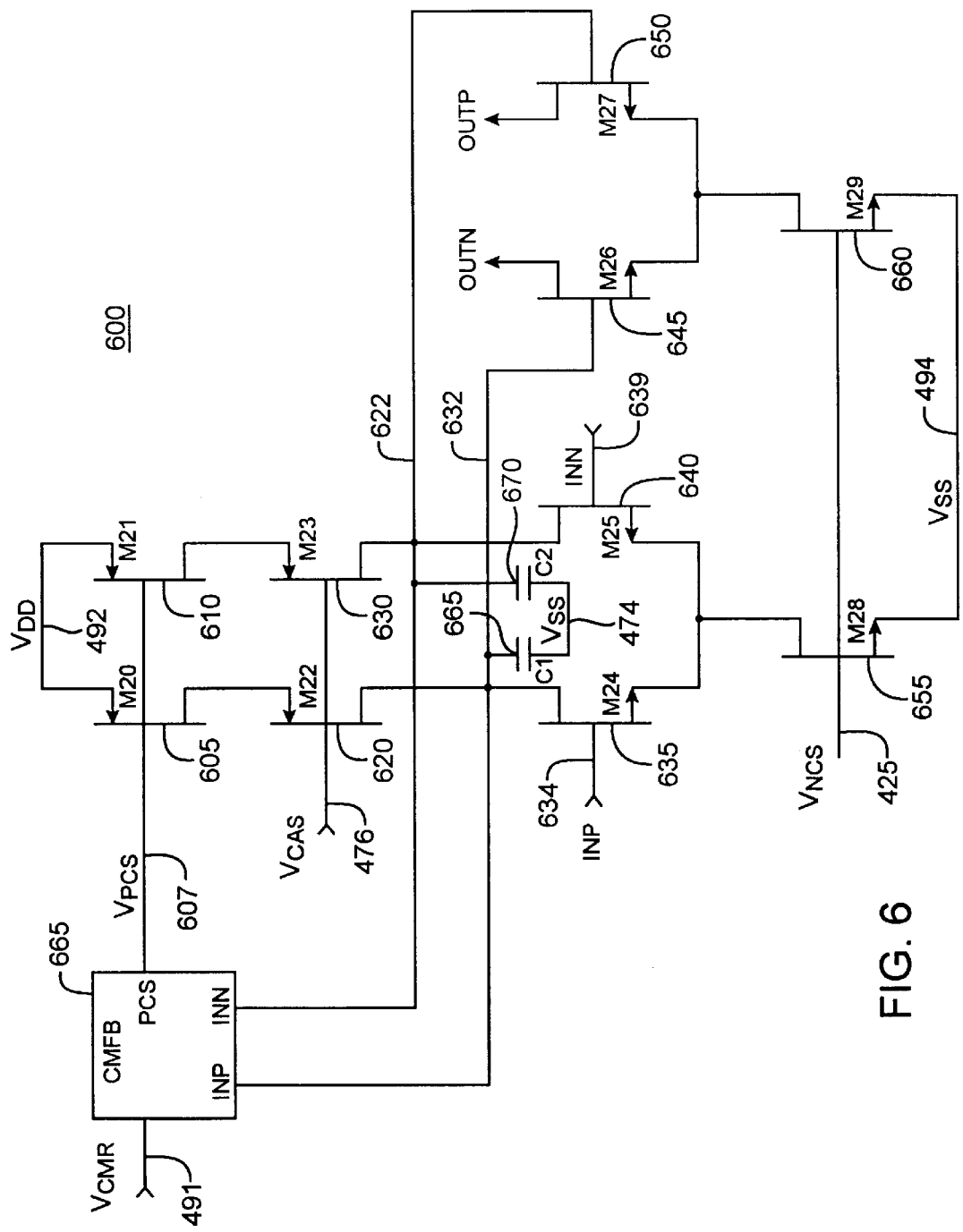
FIG. 6 is a schematic of an offset amplifier that may be used as the offset amplifier in FIG. 4.

FIG. 6 is a schematic of an offset amplifier 600 that may be used as the offset amplifier 445 in FIG. 4, and other embodiments of the present invention. Included are input differential pair M24 635 and M25 650, output differential pair M26 645 and M27 650, cascode devices M22 620 and M23 630, p-channel current sources M20 605 and M21 610, n-channel current sources M25 655 and M29 660, and common-mode feedback block 655. In one embodiment of the present invention, M20 605 and M21 610 are PMOS devices, each having a size 4.32/9, m=4, M22 620 and M23 630 are PMOS devices, each having a size 10.8/0.18, m=4, M24 635 and M25 640 are NMOS devices, each having a size 5/1, m=4, M26 645 and M27 650 are NMOS devices, each having a size 6.24/2, m=1, M28 655 and M29 660 are NMOS devices, each having a size 3.6/2.34, m=2, and C1 and C2 have values of 100 pF. It will be obvious to one skilled in the art that other sizes are possible consistent with the present invention. Also, as with the other schematics, bipolar devices may be used for some or all devices, and the circuit may be "flipped."

The common-mode feedback block 655 may have the same schematic as the common-mode feedback block shown in FIG. 5. Alternately, the common-mode feedback block 655 may have a different design. Bias voltage VNCS is applied on line 425 between the gates and sources of M28 655 and M29 660, thus generating currents in their drains. A common mode reference voltage is applied on line 491 to the common-mode feedback block 665, which generates bias voltage VPCS1 on the line 607. The VCMR signal on line 491 may be the same VCMR signal applied to the common-mode feedback block 460 in FIG. 4. Alternately, a different common mode reference voltage may be used. Common-mode feedback block 665 sets the bias voltages for nodes 622 and 632 to be equal to the voltage of the VCMR signal on line 491. VCAS is applied on line 476 to the gates of cascode devices M22 620 and M23 630. VCAS on line 476 may be the same VCAS used in FIG. 4. Alternately, a different bias line may be used for these cascode devices.

An input voltage is applied between input lines 634 and 639. These nodes, labeled by INP and INN respectively, couple to the output lines 450 and 455. A difference voltage on lines 634 and 639 results in changes in voltages on lines 622 and 632, which are applied to the gates of M26 645 and M27 650. This differential voltage generates a differential output current at notes OUTN and OUTP, which also correspondingly tie to output notes 450 and 455 in FIG. 4. Specifically, if the voltage INP on line 634 increases, the current in device M24 635 increases, lowering the voltage on line 632. This reduces the current in M26 645 and increases the current in M27 650. This, in turn, reduces the voltage at OUTP which is the same node as INP 634. In this way, differences in voltages at the output notes 450 and 455 in FIG. 4 are driven by this offset amplifier to be equal to zero.

It is desirable that the circuits react only to the DC component of the output signal and not the AC component of the output signal. That is, it is preferable that the offset voltage is made to be zero, without affecting the AC response near the IF frequency. Accordingly, the bandwidth of the circuit is limited by capacitors C1 655 and C2 670, such that it is only able to react to DC and very low-frequency signal components. Generally, it is desired that the cutoff frequency for the circuits be two decades below the frequency of the IF signal.

The transfer function for the circuit is given by the equation:

$$H(s)=Av/(1+(Av\ Rload\ gm1\ gm2\ rds/(1+s\ C\ rds))$$

Where Av is the voltage gain per amplifier stage, Rload is value of resistors R2 485 and R3 490 in FIG. 4, gm1 is the gm of differential pair M24 635 and M25 640, gm2 if the gm of output differential pair M26 645 and M27 650, rds is the drain to source resistance of M24 and M25, and C is the value of load capacitances C1 665 and C2 670. From this expression it is clear that a low frequency pole can be achieved by lowering the gms even if a relatively small capacitance value is used. This architecture results in a low power design.

It can be seen that the "gm over C" term controls the location of the pole for this high pass filter. An embodiment of the present invention uses a moscap for C1 and C2. A moscap uses the same oxide as the CMOS devices on a chip as its insulator. Thus, the values of the capacitors is inversely proportional to the oxide thickness, and is given by the equation:

$$Ctot=C'ox\ W\ L$$

where $C'ox=\epsilon ox/Tox$, Tox being the oxide thickness.
The gm of a device is also a function of the oxide thickness, and can be expressed as:

$$gm=(W/L)u\ C'ox\ Vds$$

If, in the above transfer function equation, gm2 is made small with respect to gm1, then the C'ox variance cancels resulting in a stable pole position over process variances. This compares favorably to traditional RC coupling networks where, as discussed above, the tolerance of the pole location is dependent on the variability of both the capacitor and resistor values.

Returning to FIG. 4, as above, if the common mode reference voltage VCMR on line 491 tracks VDD, then as VDD decreases, the output voltage at nodes 450 and 455 decrease in a corresponding manner. In this way, a decreasing VDD does not result in the cascode devices M5 475 and M6 480 entering the triode region, thereby reducing the output swing.

Figure 7:
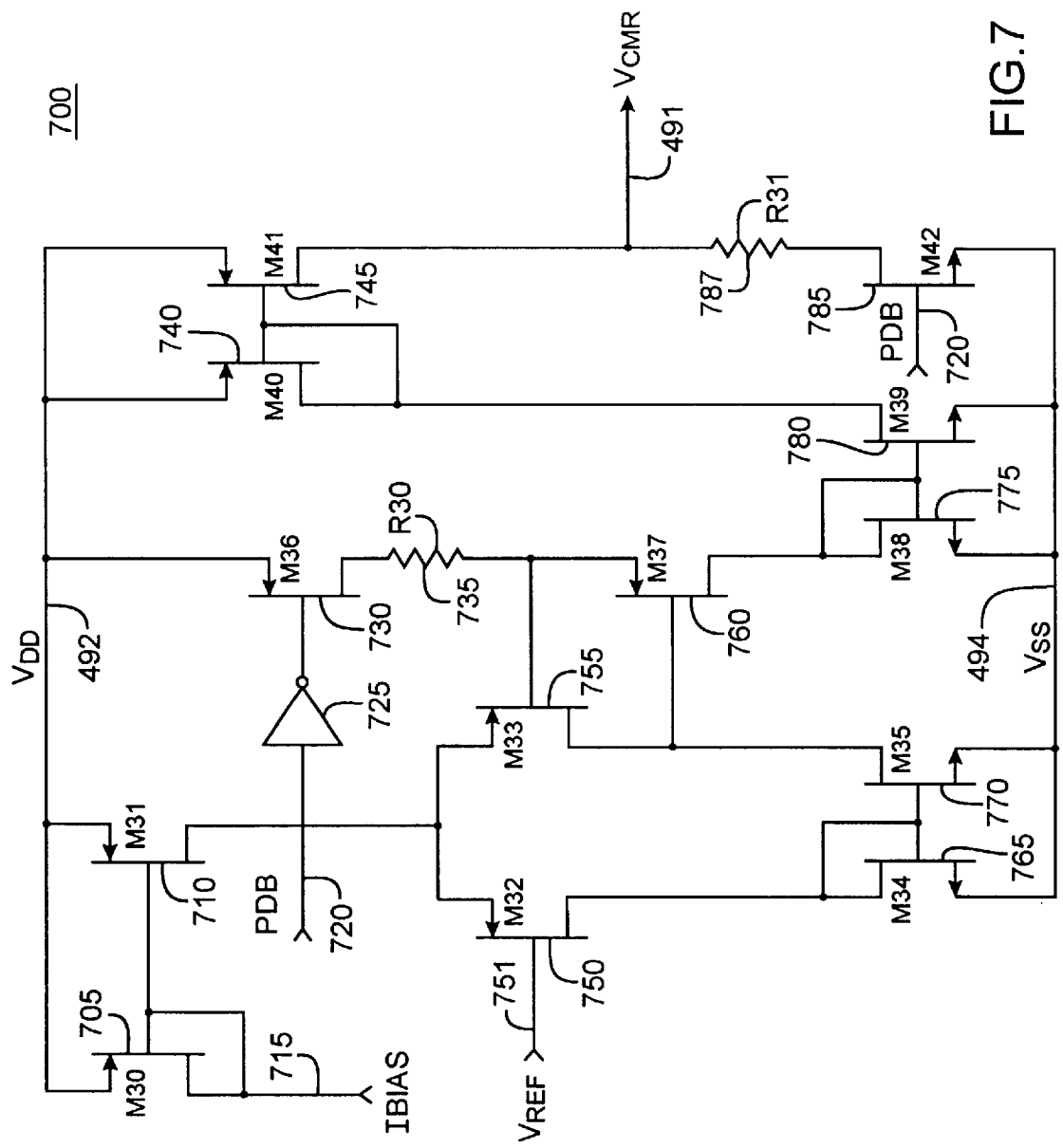
FIG. 7 is a schematic of a bias voltage generator capable of generating a bias voltage.

FIG. 7 is a schematic of a bias voltage generator 700 capable of generating a bias voltage VCMR which tracks VDD. Included are an input amplifier including a differential pair M32 750 and M33 755, and active load M34 765 and M35 770, an output source follower stage M37 760 and R30 735, a first current mirror including devices M38 775 and M39 780, a second current mirror including devices M40 740 and M41 745, and output load R31 787. Power down circuitry including inverter 725, M36 730, and M42 720 is also included. A decoupling or bypass capacitor may be added to the output. In one embodiment of the present invention, M30 705 and M31 710 are PMOS devices, each having sizes 1.44/2.5, m=2, M32 750 and M33 755 are PMOS devices, each having sizes 10.8/0.18, m=1, M34 765 and M35 770 are NMOS devices, sizes 10/5, m=2, M36 is PMOS, 10/0.18, m=1, M38 775 and M39 780 are NMOS, each at 10/10, m=10, M40 740 and M41 745 are PMOS, 10/5, m=15, M42 785 is 5/0.18, m=1, and R30 735 and R31 787 each have a resistance of 100 k ohms. It will be obvious to one skilled in the art that other sizes are possible consistent with the present invention. Also, as with the other schematics, bipolar devices may be used for some or all devices, and the circuit may be inverted.

In the operating mode, the signal PDB on line 720 is high, thus the output of inverter 725 is low, and devices M36 730 and M42 785 are conducting. A bias current is applied to line 715, and is mirrored by devices M30 705 and M31 710 to the input amplifier stage.

A reference voltage is applied on line 751 to the gates of device M32 750. This reference voltage may be equal to a bandgap voltage, a multiple of the bandgap voltage, or a portion of the bandgap voltage. Alternately, the reference voltage may be another suitable voltage. In a preferred embodiment, Vref remains fairly constant with respect to VSS on line 495 over temperature, supply, and processing. The feedback around the input amplifier is such that the gate voltages of M32 750 and M33 755 are equal. Specifically, if Vref increases, the current in M3 750 decreases, thereby decreasing the currents and M34 765 and M35 770, which increases the voltage at the gate of M37. This increases the voltage at the gates of M33 755, such that the gates of M33 755 and M32 750 have equal voltages.

If the drain-to-source voltage of M36 730 is negligible, the voltage across R30 735 is equal to VDD minus Vref. The current in R30 735 is equal to VDD minus Vref divided by the value of R30. This current flows through source follower device M37 760, through the first and second current mirrors, and into load resistor R31 787. If resistor R31 is equal to resistor R30 735, and the drain-to-source voltages of M36 and M42 785 match, the output voltage VCMR on line 491 is equal to VDD minus Vref.

Returning to FIG. 4, this means that the common-mode feedback block 460 adjusts the bias voltage of VPCS on line 473 such that the average output voltages on lines 450 and 455 are equal to VDD minus Vref Thus, the average voltage drop from VDD to Vout is equal to Vref. Accordingly, as VDD changes, cascode devices M5 475 and M6 480 see the same voltage, meaning that their gate-to-source voltages and thus the currents in M7 465 and M8 470 are not modulated by changes in VDD on line 492.

Figure 8:
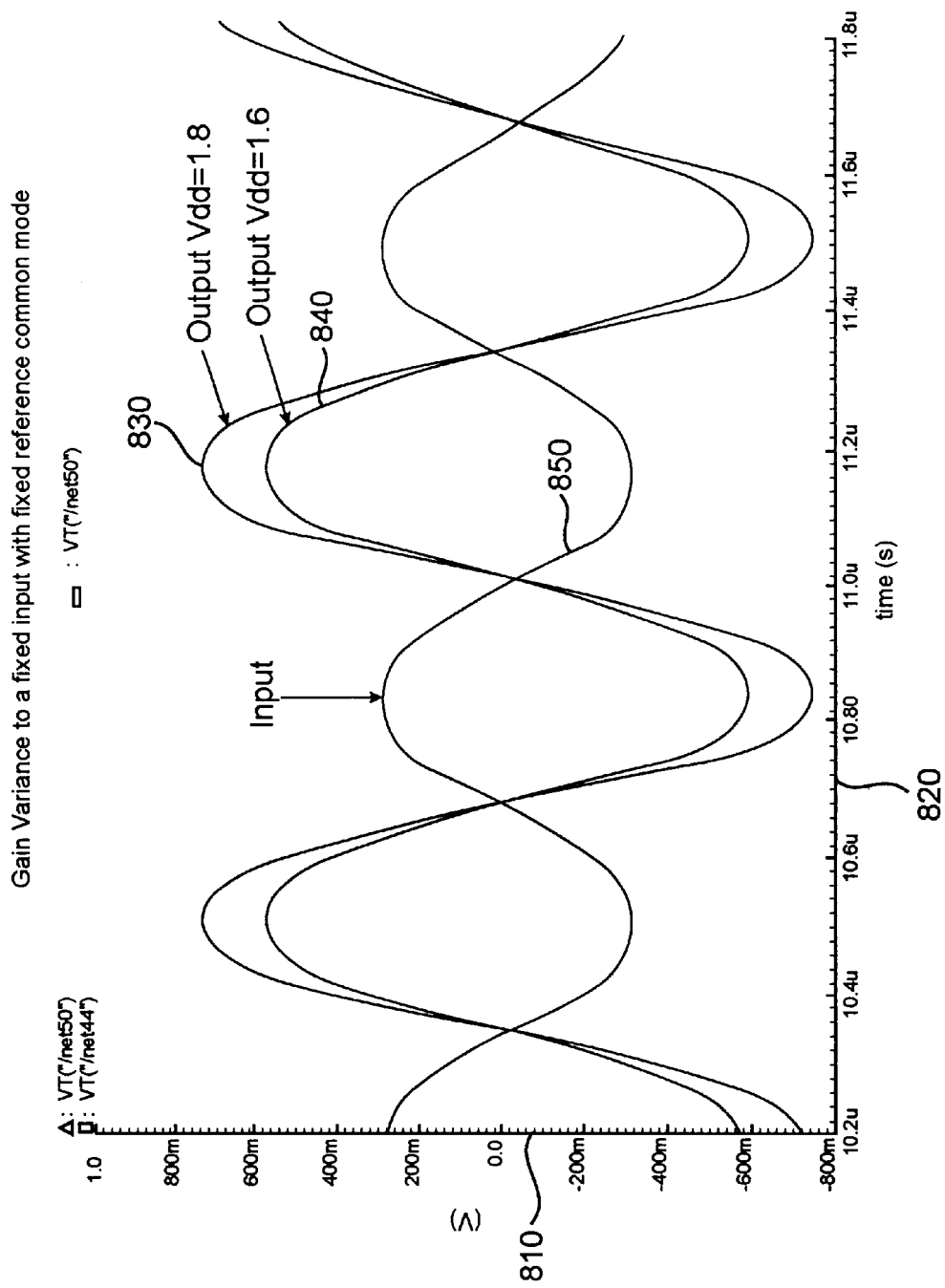
FIG. 8 shows input and output voltage waveforms of a logarithmic amplifier without the biasing configuration used by embodiments of the present invention.

FIG. 8 shows input and output voltage waveforms of a logarithmic amplifier without the biasing configuration used by embodiments of the present invention. Shown are input waveform 850, and output waveforms 830 and 840. The output waveform 830 corresponds to a VDD voltage of 1.8, and the waveform 840 corresponds to a VDD of 1.6 volts. The waveforms are plotted along the Y axis 810, which indicates voltage, and the X axis 820, which indicates time. The input waveform 850 is used to generate both output waveforms. As can be seen by inspection, the amplitude of the output waveform at the lower supply has dropped with the decrease in supply voltage.

Figure 9:
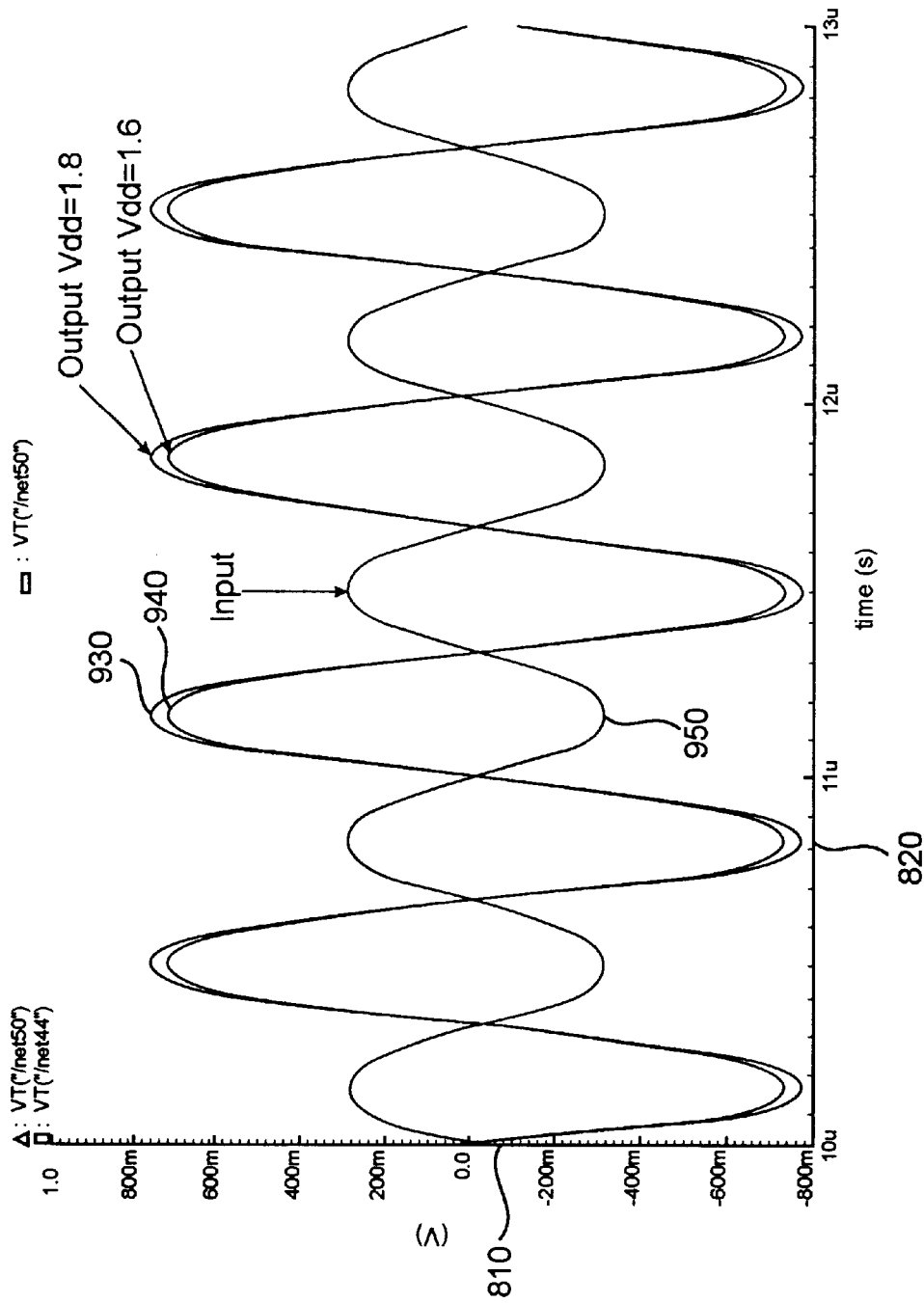
FIG. 9 shows the input and output voltage waveforms for logarithmic amplifier with the biasing configuration used by embodiments of the present invention.

FIG. 9 shows the input and output voltage waveforms for logarithmic amplifier with the biasing configuration used by embodiments of the present invention. Shown are input waveforms 950, and output waveforms 930 and 940. The waveform 930 corresponds to a VDD voltage of 1.8 volts and the waveform 940 corresponds to a VDD of 1.6 volts. The waveforms are plotted along the Y axis 910, which indicates voltage, and the X axis 920, which indicates time, as before. The same input waveform 950 is used to generate both output waveforms. As can be seen by inspection, the output waveform at the lower supply has dropped with the decrease in supply voltage by a much smaller amount, thus the PSRR of the circuit has been greatly improved.

Figure 10:
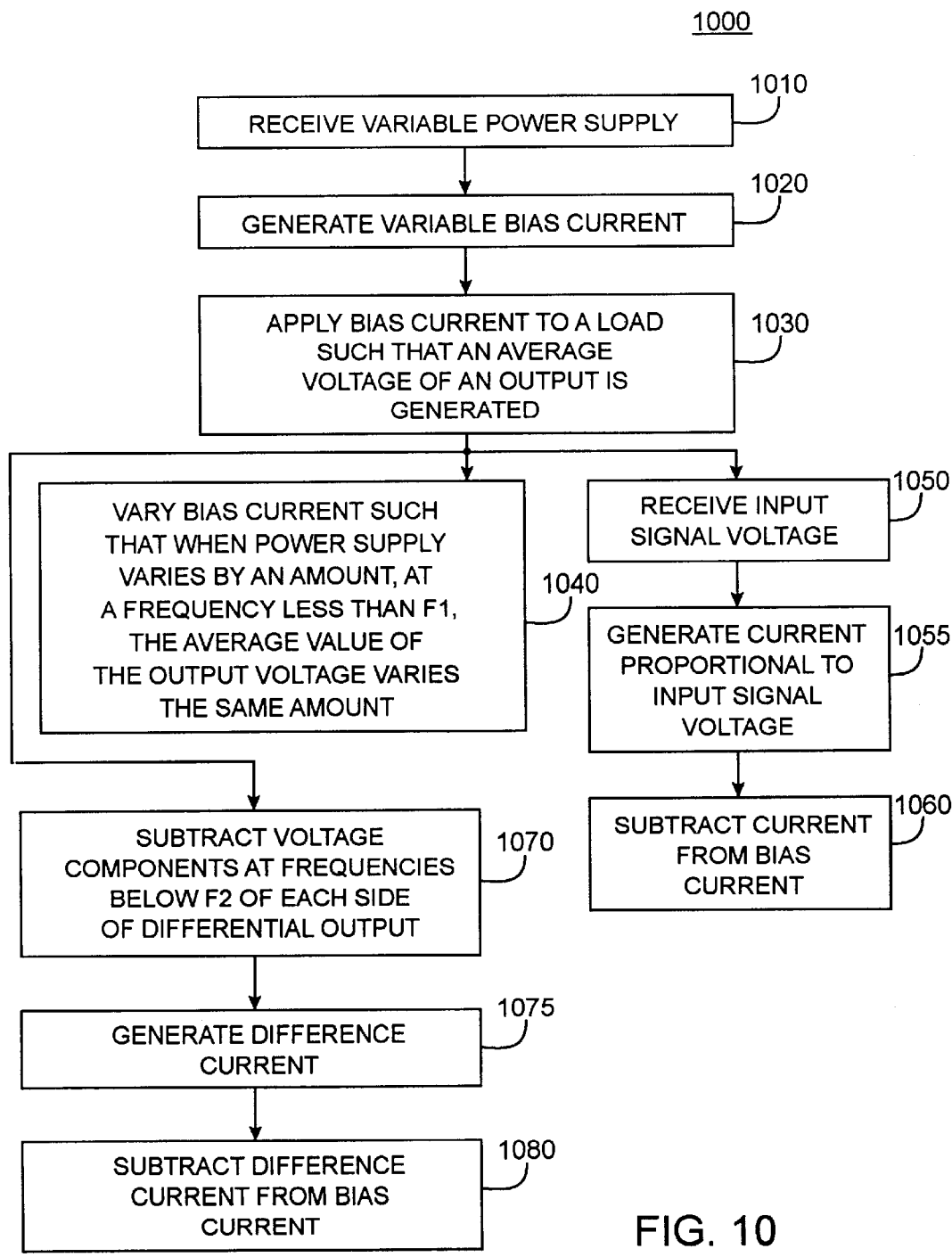
FIG. 10 is a flow charts of a method of amplifying a signal consistent with an embodiment of the present invention.

FIG. 10 is a flow chart of a method of amplifying a signal consistent with an embodiment of the present invention. In act 1010, a variable power supply is received by the amplifier. In act 1020, a variable bias current is generated, and the bias current is applied to a load such that in average voltage of an output is generated in act 1030. At this point, several things occur simultaneously. Specifically, an AC signal is used to modulate the bias current, and the bias current is made to track changes in the supply voltage. Additionally, the offsets in the resulting output can be reduced.

If there is an input signal, that input signal is received in act 1050. A current proportional to the input signal is generated in act 1050. This current is subtracted from the bias current in act 1060.

In act 1040, the bias current is varied such that when the power supply varies by an amount at a frequency less than a first frequency, the average value of the output voltage varies the same amount. The response is limited to these frequencies to avoid noise injection into the output.

If it is desired that any offset signal is removed or reduced, the signal components below a second frequency are subtracted from each side of the differential output in act 1070. From this offset signal, a difference current is generated in act 1175, which is subtracted from the bias current in act 1180. The second frequency is comparatively low, such that the signal itself is not canceled or reduced due to the offset removal.

Figure 11:
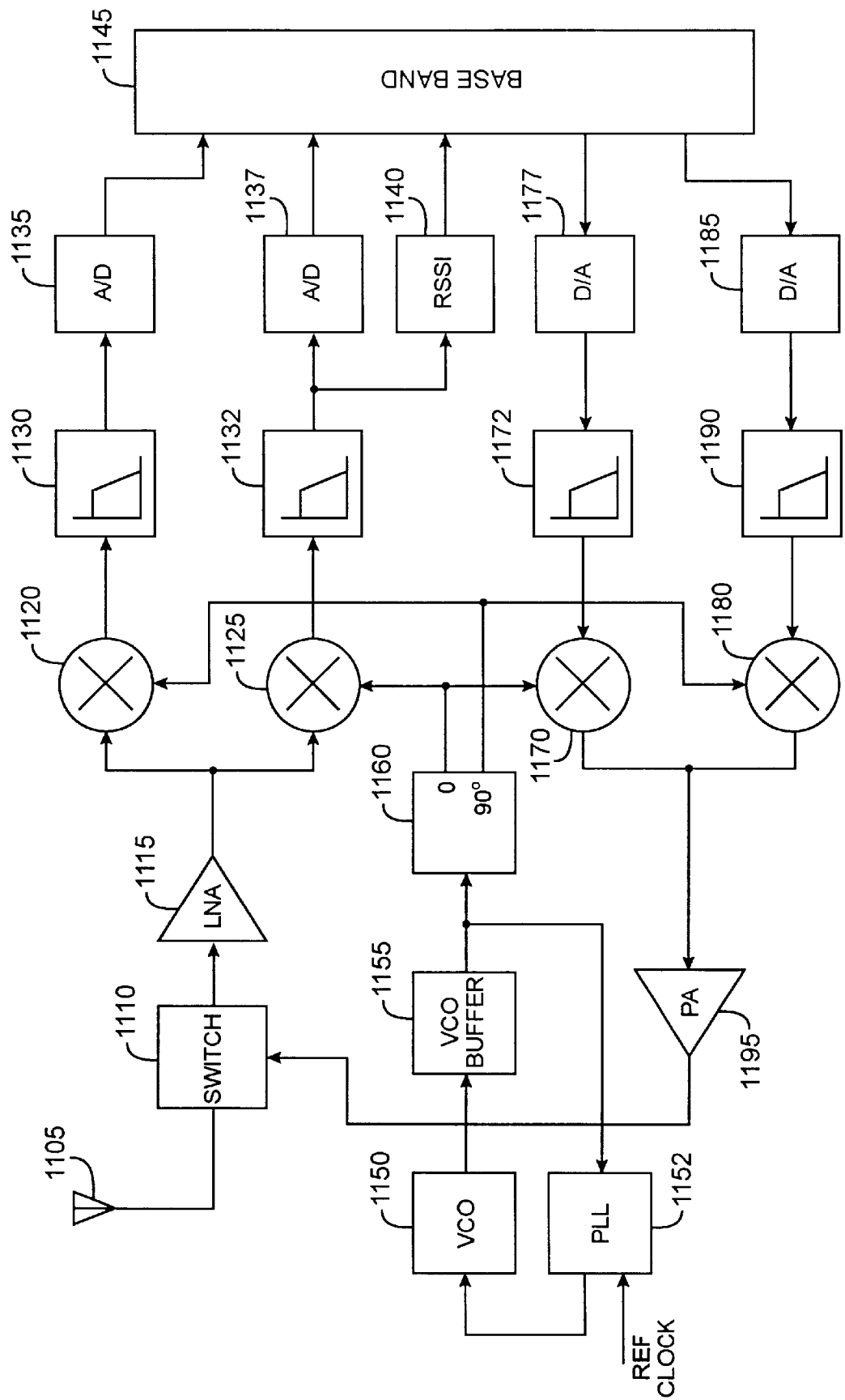
FIG. 11 is a block diagram a wireless transceiver that may make use of amplifiers consistent with embodiments of the present invention.

FIG. 11 is a block diagram for a wireless transceiver that may make use of logarithmic amplifiers consistent with embodiments of the present invention. For example, the RSSI block 1140 may use of such an logarithmic amplifier.

Included in block diagram 1100 are an antenna 1105, a switch 1110, low noise amplifier 1115, downconverter mixers 1120 and 1125, low pass filters 1130 and 1132, analog to digital (A/D) converters 1135 and 1137, RSSI block 1140, baseband circuit 1145, digital to analog (D/A) converters 1177 and 1185, low pass filters 1172 and 1190, upconverter mixers 1170 and 1180, power amplifier 1195, voltage controlled oscillator (VCO) 1150, VCO buffer 1155, PLL 1152, and polyphase filter 1160. Most of the circuits are typically formed on an integrated circuit, though the antenna may be off-chip, and the baseband may be on a separate integrated circuit.

VCO 1150 generates a local oscillator (LO) signal having a frequency near that of the signal to be received on antenna 1105. VCO buffer 1155 filters and amplifies the LO signal from the VCO and provides it to polyphase filter 1160 and PLL 1152. The VCO buffer may be a tuned RF amplifier. Examples of such tuned RF amplifiers can be found in jointly assigned, copending U.S. application Ser. No. 09/835,021, filed Apr. 13, 2001, attorney docket number 20408-001500US, titled "Low Power Large Signal RF Tuned Buffer Amplifier," which is hereby incorporated by reference. PLL 1152 typically includes dividers and a frequency synthesizer. The PLL 1152 receives a reference clock 1154 which is generated by a crystal or other similar stable frequency source, compares its phase to that of a divided down version of the LO signal, and provides a control voltage to the VCO 1150. Polyphase filter 1160 provides quadrature signals of the LO signal to the transmit and receive mixers. In the receive mode, the received signal appears at antenna 1105, and is coupled through the switch 1110 to the low noise amplifier 1115. The signal is amplified, and provided to the downconverter mixers 1120 and 1125, which generate incident and quadrature intermediate frequency (IF) signals. The IF signals are filtered by low pass filters 1130 and 1132, and are digitized by A/D converters 1135 and 1137, and provided to the baseband 1145. Baseband 1145 typically includes a modem and digital signal processing (DSP) circuits.

The amplitude of the IF signal provided by the downconverter is detected by RSSI block 1140 and presented to the baseband circuit 1145. The RSSI block 1140 may receive an input from one or both of the outputs of the low pass filters 1130 and 1132. Alternately, or in combination, the RSSI block may receive an input from one or both of the outputs of the mixers 1120 and 1125. RSSI block 1140 may contain logarithmic amplifiers and rectifiers.

In the transmit mode, baseband circuit 1145 provides digitized IF signals to D/A converters 1177 and 1185, which provide analog IF signals to the low pass filters 1172 and 1190. The transmit mixers upconvert the IF signals to the RF frequency, were it is gained up by power amplifier 1195, and presented for transmission through the switch 1110 to the antenna 1105.

Figure 12:
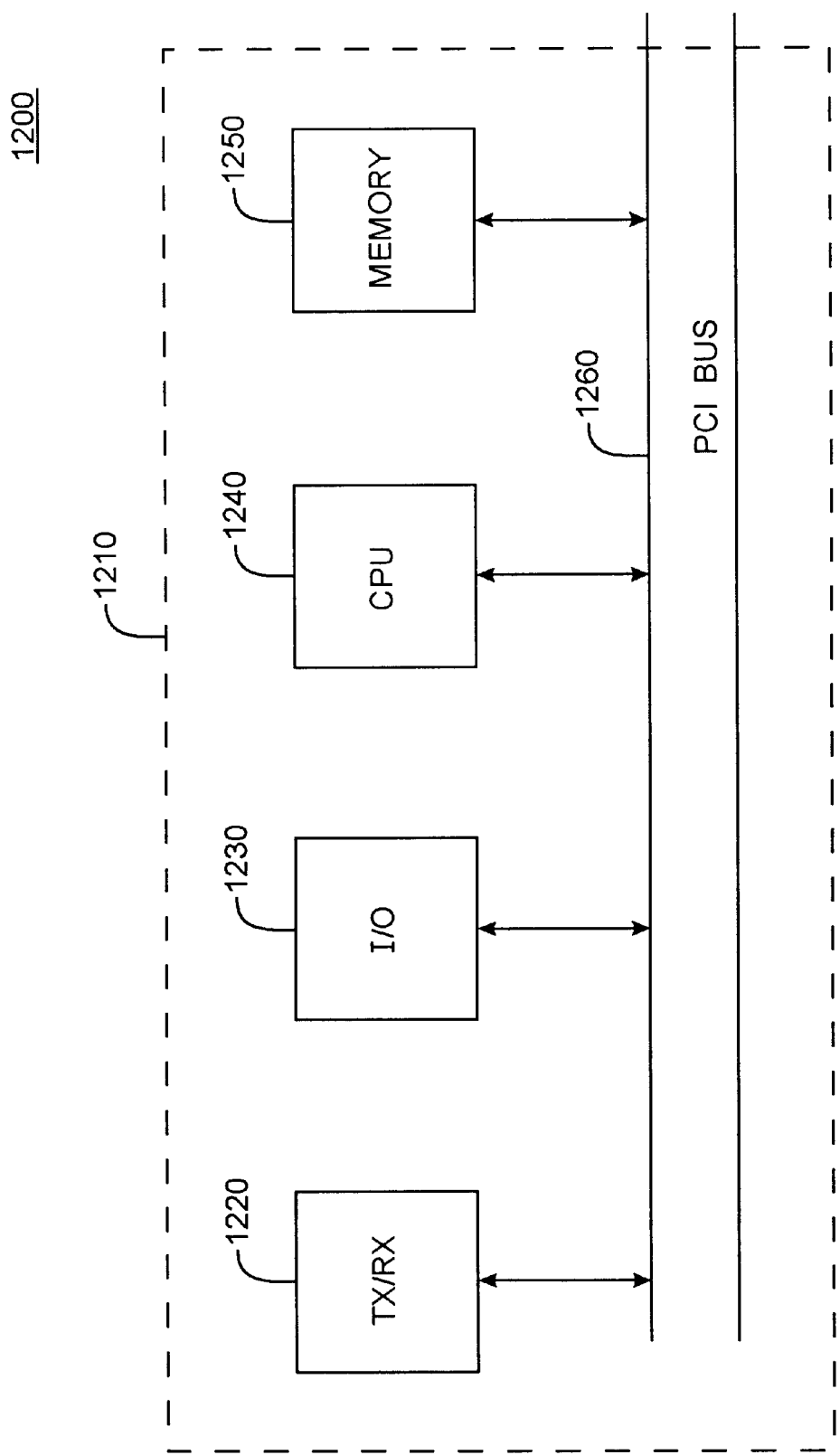
FIG. 12 shows a simplified block diagram for one example of an electronic system including circuit blocks using logarithmic amplifiers according to the present invention.

The logarithmic amplifier as embodied in the transceiver of FIG. 11 allows for implementation of various electronic systems that are capable of wireless RF communication. Such electronic systems include desktop and laptop personal computers, mobile telephone, television and internet devices, home gateways and media servers, portable digital music devices, data pipes, and the like. FIG. 12 shows a simplified block diagram for such an electronic system. As an example, a desktop personal computer 1200 is shown. Personal computer 1200 includes a central processing unit (CPU) 1240, memory 1250, input/output devices 1230, and transceiver 1220 coupled to a common personal computer interface (PCI) bus 1260. Alternately, transceiver 1220 may be incorporated into input/output devices 1230. Transceiver 1220 is of the type described above in connection with FIG. 11. Transceiver 1220 allows system 1200 to wirelessly communicate with other RF wireless devices.

Embodiments of the present invention have been explained with reference to particular examples and figures. Other embodiments will be apparent to those of ordinary skill in the art. Therefore, it is not intended that this invention be limited except as indicated by the claims.

What is claimed is:

1. A method of amplifying signals comprising:
    receiving a variable power supply;
    generating a variable bias current;
    applying the variable bias current to a load such that an average output voltage is generated;
    receiving an input signal;
    generating a first current proportional to the input signal; and
    subtracting the first current from the variable bias current,
    wherein as the variable power supply changes by a first amount, the variable bias current is varied such that the average output voltage varies by the first amount, and
    wherein the variable bias current is generated by a common-mode feedback circuit,
    the method further comprising:
        determining an offset at the output;
        generating a second current proportional to the offset; and
        subtracting the second current from the bias current.

2. The method of claim 1 wherein the second current is generated by an offset amplifier.

3. A circuit for amplifying signals comprising:
    an input stage configured to convert an input signal to a first current;
    a current source stage configured to provide a bias current capable of being varied;
    an output stage configured to convert the bias current, less the first current, to an output voltage; and
    a common-mode feedback circuit configured to receive a common-mode feedback voltage and the output voltage,
    wherein the common-mode feedback circuit varies the bias current such that an average of the output voltage is equal to the common-mode feedback voltage, and further comprising:
        an offset amplifier configured to reduce an affect voltage at the voltage output.

4. The circuit of claim 3 wherein the input stage comprises a linearized differential pair.

5. The circuit of claim 4 wherein the current source stage comprises cascaded current sources.

6. The circuit of claim 5 wherein the output stage comprises load resistors.

7. The circuit of claim 6 wherein the linearized differential pair comprises NMOS devices.

8. The circuit of claim 7 wherein the cascode current sources comprise PMOS current sources and PMOS cascode devices.

9. A circuit for amplifying signals comprising:
    a first device coupled between a first node and a first terminal of a resistor, having a control electrode coupled a first input terminal;
    a second device coupled between a second node and a second terminal of the resistor, having a control electrode coupled a second input terminal;
    a third device coupled between a first supply node and the first node;
    a fourth device coupled between the first supply node and the second node;
    a first output load coupled between the first node and the second supply node;
    a second output load coupled between the second node and the second supply node;
    a common-mode feedback circuit having a first input coupled to the first node, a second input coupled to the second node, and an output coupled to a control electrode of the third device and a control electrode of thin fourth device;
    an offset-correcting amplifier having a first input coupled to the first node, a second input coupled to the second node, and a first output coupled to the first node; and
    a bias circuit coupled to the common-mode feedback circuit,
    wherein the bias circuit provides a bias voltage to the common-mode feedback circuit such that when a power supply of the integrated circuit changes by a first voltage, a common-mode voltage at the first and second output loads changes by approximately the first voltage.

10. The circuit of claim 9 further comprising:
    a fifth device coupled between the first node and the first output load; and
    a sixth device coupled between the second node and the second output load.

11. The circuit of claim 10 further comprising:
    a seventh device coupled between the first terminal of the resistor and the second supply node; and
    an eighth device coupled between the second terminal of the resistor and the second supply node.

12. The circuit of claim 11 wherein the first and second devices are NMOS devices.

13. The circuit of claim 12 wherein the third and fourth devices are PMOS devices.

14. The circuit of claim 12 wherein the first output load and second output load are resistors.

15. An integrated circuit, wherein the integrated circuit comprises the circuit of claim 9.

16. A transceiver comprising the circuit of claim 9.

17. An computing device comprising:
    a memory;
    a central processing unit coupled to the memory; and the transceiver of claim 16 coupled to the central processing unit.

18. The circuit of claim 9 wherein the offset-correcting amplifier further comprises a second output coupled to the second node.

19. An integrated circuit comprising a logarithmic amplifier comprising:

a plurality of amplifier stages coupled in series;

a plurality of rectifier stages, each coupled to an output of an amplifier stage end having an output, each of the outputs of the plurality of rectifier stages coupled together;

wherein each of the amplifier stages comprise:
  a linearized differential input stage;
  a current source load coupled to the linearized differential input stage;
  a differential load coupled to the current source load;
  a cannon-mode feedback circuit having an input coupled to the differential load, and an output coupled to the current source load; and
  an offset correcting amplifier having an input coupled to the differential load and an output coupled to the differential load, wherein the plurality of amplifier stages are coupled directly together without the use of coupling capacitors, and wherein the common-mode feedback circuit is biased such that when a power supply of the integrated circuit changes by a first voltage, a common-mode voltage at the first and second output loads changes by approximately the first voltage.

20. The integrated circuit of claim 19 further comprising a cascode stage coupled between the current source load and the differential load.

21. The integrated circuit of claim 20 wherein the linearized differential input stage comprises a resistor coupled between a source of a first NMOS device and a source of a second NMOS device.

22. The integrated circuit of claim 21 wherein the differential load comprises a first load and a second load.

23. The integrated circuit of claim 22 wherein the current source load comprises first and second PMOS devices, each having a gate coupled to the output of the common-mode feedback circuit.

* * * * *